(12) United States Patent
Kim et al.

(10) Patent No.: US 8,637,942 B2
(45) Date of Patent: Jan. 28, 2014

(54) TRANSISTOR HAVING A METAL NITRIDE LAYER PATTERN, ETCHANT AND METHODS OF FORMING THE SAME

(75) Inventors: Sang-Yong Kim, Yongin-si (KR); Ji-Hoon Cha, Seoul (KR); Woo-Gwan Shim, Yongin-si (KR); Chang-Ki Hong, Seongnam-si (KR); Sang-Jun Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 775 days.

(21) Appl. No.: 12/461,992

(22) Filed: Aug. 31, 2009

(65) Prior Publication Data

US 2010/0019292 A1 Jan. 28, 2010

Related U.S. Application Data

(62) Division of application No. 11/358,082, filed on Feb. 22, 2006, now Pat. No. 7,700,496.

(30) Foreign Application Priority Data

Feb. 22, 2005 (KR) ........................ 10-2005-0014714

(51) Int. Cl.
*H01L 29/78* (2006.01)

(52) U.S. Cl.
USPC ............................ 257/412; 257/288; 257/408

(58) Field of Classification Search
USPC .......................................... 257/412, 288, 408
See application file for complete search history.

(56) References Cited

U.S. PATENT DOCUMENTS

| 5,658,671 | A | 8/1997 | Fukushi |
| 6,503,845 | B1 | 1/2003 | Nallan |
| 6,592,777 | B2 | 7/2003 | Chen et al. |
| 6,933,580 | B2 | 8/2005 | Chen et al. |
| 2003/0228763 | A1 | 12/2003 | Schroeder et al. |
| 2004/0113171 | A1* | 6/2004 | Chiu et al. ..................... 257/119 |
| 2005/0042785 | A1* | 2/2005 | Okamoto ........................ 438/30 |
| 2005/0095867 | A1* | 5/2005 | Shimada ....................... 438/720 |
| 2005/0110098 | A1* | 5/2005 | Yoshihara ..................... 257/371 |
| 2006/0060565 | A9* | 3/2006 | Nallan et al. .................... 216/67 |

FOREIGN PATENT DOCUMENTS

| JP | 2004-179612 | 6/2004 |
| KR | 10-2003-0066673 | 8/2003 |

* cited by examiner

*Primary Examiner* — Jack Chen

(74) *Attorney, Agent, or Firm* — Harness, Dickey & Pierce, P.L.C.

(57) ABSTRACT

A transistor having a metal nitride layer pattern, etchant and methods of forming the same is provided. A gate insulating layer and/or a metal nitride layer may be formed on a semiconductor substrate. A mask layer may be formed on the metal nitride layer. Using the mask layer as an etching mask, an etching process may be performed on the metal nitride layer, forming the metal nitride layer pattern. An etchant, which may have an oxidizing agent, a chelate agent and/or a pH adjusting mixture, may perform the etching. The methods may reduce etching damage to a gate insulating layer under the metal nitride layer pattern during the formation of a transistor.

1 Claim, 14 Drawing Sheets

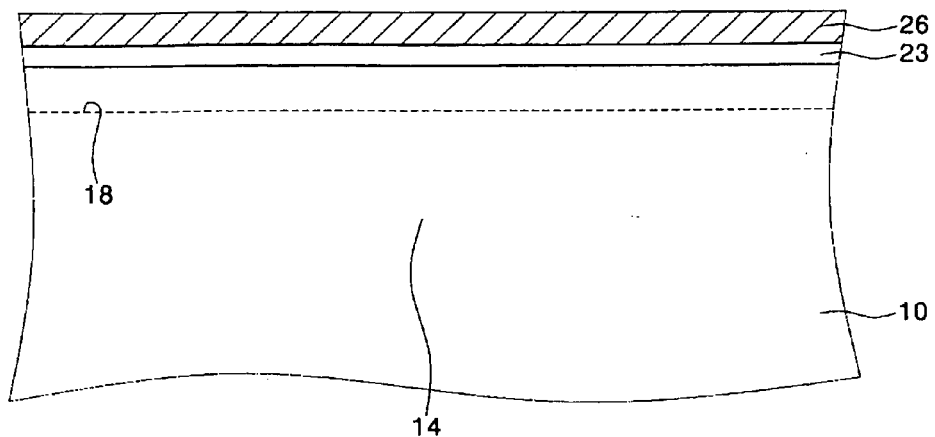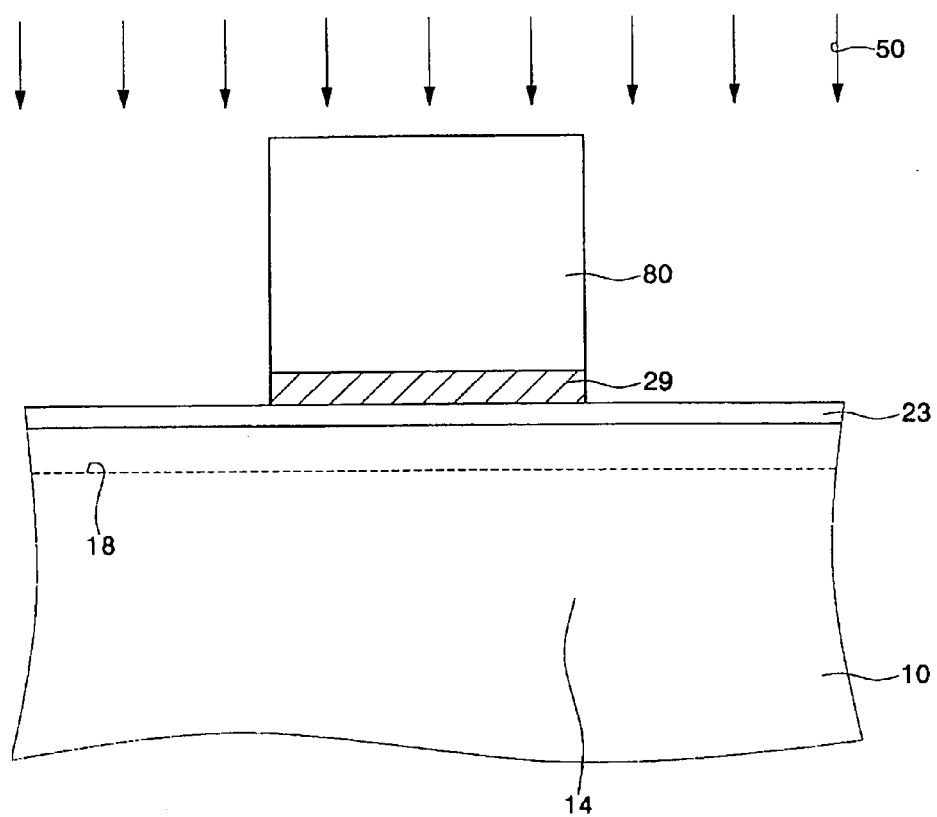

TRANSISTOR HAVING A METAL NITRIDE LAYER PATTERN, ETCHANT AND METHODS OF FORMING THE SAME

PRIORITY STATEMENT

This is a divisional of, and claims priority under 35 U.S.C. §120 to, U.S. application Ser. No. 11/358,082, filed Feb. 22, 2006 now U.S. Pat. No. 7,700,496. This application claims the benefit to Korean Patent Application No. 2005-14714, filed Feb. 22, 2005, in the Korean Intellectual Property Office, the contents of which is hereby incorporated herein by reference in its entirety.

BACKGROUND OF THE INVENTION

1. Field of the Invention

Example embodiments of the present invention relate to a transistor in a semiconductor device, an etchant and methods of forming the same. Other example embodiments relate to a transistor having a metal nitride layer pattern, an etchant and methods of forming the same.

2. Description of the Related Art

In order to obtain a higher speed semiconductor device, the thickness of a gate insulating layer in a transistor may be reduced. Prior to reducing the thickness, the gate insulating layer may be formed with a higher dielectric constant (high-k) material on the semiconductor substrate in order to maintain electrostatic capacitance of the gate insulating layer. Further, a gate electrode may be formed in the transistor using a metal nitride layer and/or a poly-silicon layer stacked on the gate insulating layer. The metal nitride layer may be used for reducing and/or preventing depletion of charges in the poly-silicon layer during the driving of the transistor.

The gate electrode may be formed by performing an etching process on a predetermined region of the poly-silicon layer and/or the metal nitride layer. The etching process may use a plasma etchant to etch the poly-silicon layer and/or the metal nitride layer.

Using a plasma etchant on the metal nitride layer may cause etching damage to the gate insulating layer and/or the semiconductor substrate. In addition, the etching process may remove a portion of the semiconductor substrate by etching the gate insulating layer exposed by the gate electrode. This may cause deterioration in electrical characteristics of the transistor.

The prior art acknowledges a method of etching a tantalum nitride layer in a high density plasma. The tantalum nitride layer may be exposed to the high density plasma. The tantalum nitride layer may be formed between a dielectric layer and a photoresist pattern stacked on the semiconductor substrate. The high density plasma may be formed using a source gas including a primary etchant gas and/or a profile-control additive. The tantalum nitride layer may be etched using the high density plasma to form a tantalum nitride gate electrode on the dielectric layer.

The conventional methods may cause plasma damage to the dielectric layer and/or the semiconductor substrate during the formation of the gate electrode. In order to reduce the plasma damage, additional unit processes may be needed. However, additional unit processes may increase the cost of fabricating the gate electrode on the semiconductor substrate.

SUMMARY OF THE EXAMPLE EMBODIMENTS

Example embodiments of the present invention provide a transistor, an etchant and methods of forming the same. Other example embodiments provide a transistor having a metal nitride layer pattern, an etchant and methods of forming the same.

According to example embodiments of the present invention, methods of forming a transistor capable of reducing etching damage to a gate insulating layer and/or a semiconductor substrate by performing an etching process with an etchant on a metal nitride layer are also provided.

According to example embodiments of the present invention, a gate insulating layer and/or a metal nitride layer may be sequentially formed on a semiconductor substrate. A gate electrode and/or a gate capping layer pattern may be sequentially formed on the metal nitride layer. An etching process may be performed on the metal nitride layer using the gate capping layer pattern and/or the gate electrode as an etching mask and/or the gate insulating layer as an etching buffer layer.

According to other example embodiments of the present invention, a gate insulating layer, a metal nitride layer and/or a mask pattern may be sequentially formed on a semiconductor substrate. An etching process may be performed on the metal nitride layer by using the mask pattern as an etching mask and/or the gate insulating layer as an etching buffer layer. The etching process may form a metal nitride layer pattern. The mask pattern may be removed from the semiconductor substrate. A gate electrode and/or a gate capping layer pattern may be sequentially formed on the metal nitride layer pattern.

Example embodiments of the present invention also provide a semiconductor transistor which may include a gate insulating layer formed on a semiconductor substrate; and a patterned metal nitride layer formed on the gate insulating layer after etching a metal nitride layer. The etching process may use a mask layer as an etching mask and the gate insulating layer as an etching buffer layer.

According to yet other example embodiments, an etchant, which may have an oxidizing agent, a chelate agent and/or a pH adjusting mixture, may perform the etching. The metal nitride layer may be formed using tantalum nitride (TaN).

BRIEF DESCRIPTION OF THE DRAWINGS

Example embodiments of the present invention will become more apparent from the following detailed description taken in conjunction with the accompanying drawings. FIGS. 1-18 represent non-limiting example embodiments of the present invention as described herein.

FIGS. 1 and 2 are plane views illustrating a transistor according to example embodiments of the present invention;

FIGS. 3 to 9 are cross sectional views illustrating a method of forming a transistor according to example embodiments of the present invention, along line I-I' of FIG. 1 respectively;

FIGS. 10 to 16 are cross sectional views illustrating a method of forming a transistor according to example embodiments of the present invention, along line II-II' of FIG. 2; and FIGS. 17 and 18 are graphs illustrating etching rate of an enchant used in FIGS. 3 to 16 according to example embodiments of the present invention.

DETAILED DESCRIPTION OF THE EXAMPLE EMBODIMENTS

Figure 1:
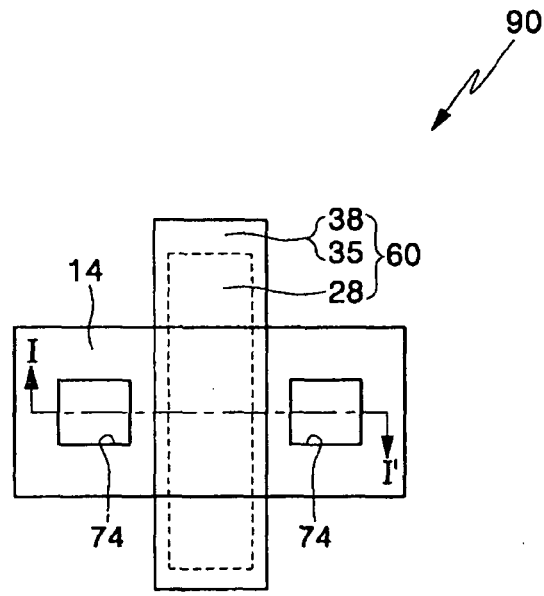

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

In the example embodiments of the present invention, like reference numeral denote like elements.

Example embodiments of the present invention provide a transistor and methods of forming the same. Other example embodiments provide a transistor having a metal nitride layer pattern and methods of forming the same.

Figure 2:
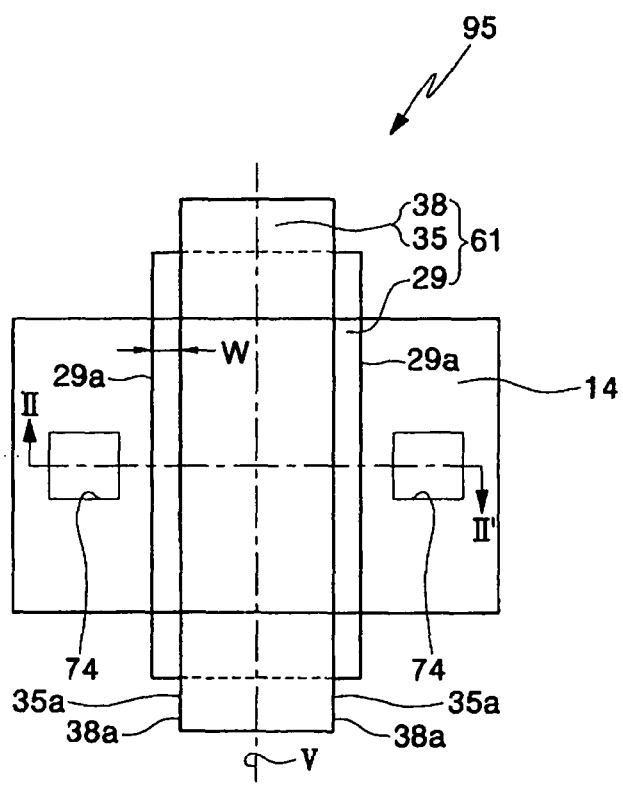

FIGS. 1 and 2 are plane views showing a transistor according to example embodiments of the present invention. FIGS. 3 to 9 are cross sectional views illustrating a method of forming a transistor according to example embodiments of the present invention, along line I-I' of FIG. 1. FIGS. 10 to 16 are cross sectional views illustrating a method of forming a transistor according to example embodiments of the present invention, along line II-II' of FIG. 2.

Figure 3:
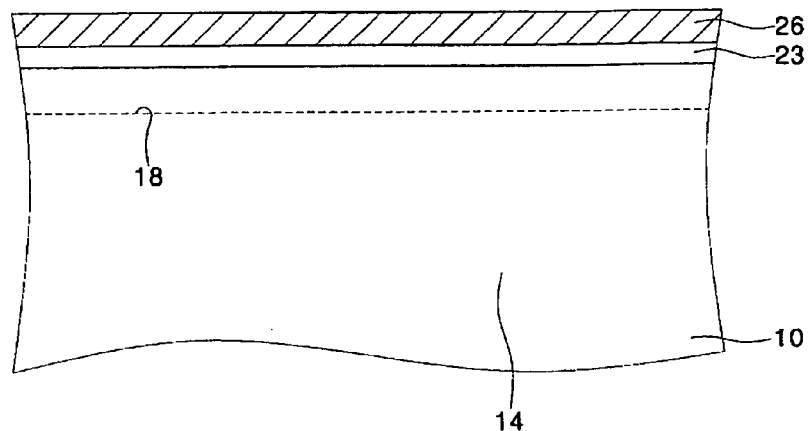

Referring to FIGS. 1 to 3 and FIGS. 10 and 11, in accordance with example embodiments of the present invention, a channel region 18 may be formed on an active region 14 of a semiconductor substrate 10 as shown in FIGS. 3 and 10. The channel region 18 may be formed using impurity ions. The semiconductor substrate 10 may be formed to have p-type and/or n-type conductivity. The channel region 18 may be formed to have a similar conductivity type as the semiconductor substrate 10. The channel region 18 may be formed to have a conductivity type different from the semiconductor substrate 10.

In accordance with another example embodiment of the present invention, a gate insulating layer 23 and/or a metal nitride layer 26 may be formed on the semiconductor substrate having the channel region 18, as shown in FIGS. 3 and 10. The metal nitride layer 26 may be formed using tantalum nitride (TaN). The gate insulating layer 23 may be formed of an insulating layer having a high dielectric constant (high-k). The gate insulating layer 23 may be formed by at least one selected from the group consisting of aluminum oxide ($Al_2O_3$), lanthanum oxide ($La_2O_3$), hafnium oxide ($HfO_2$) and/or tantalum oxide ($Ta_2O_5$).

Figure 6:
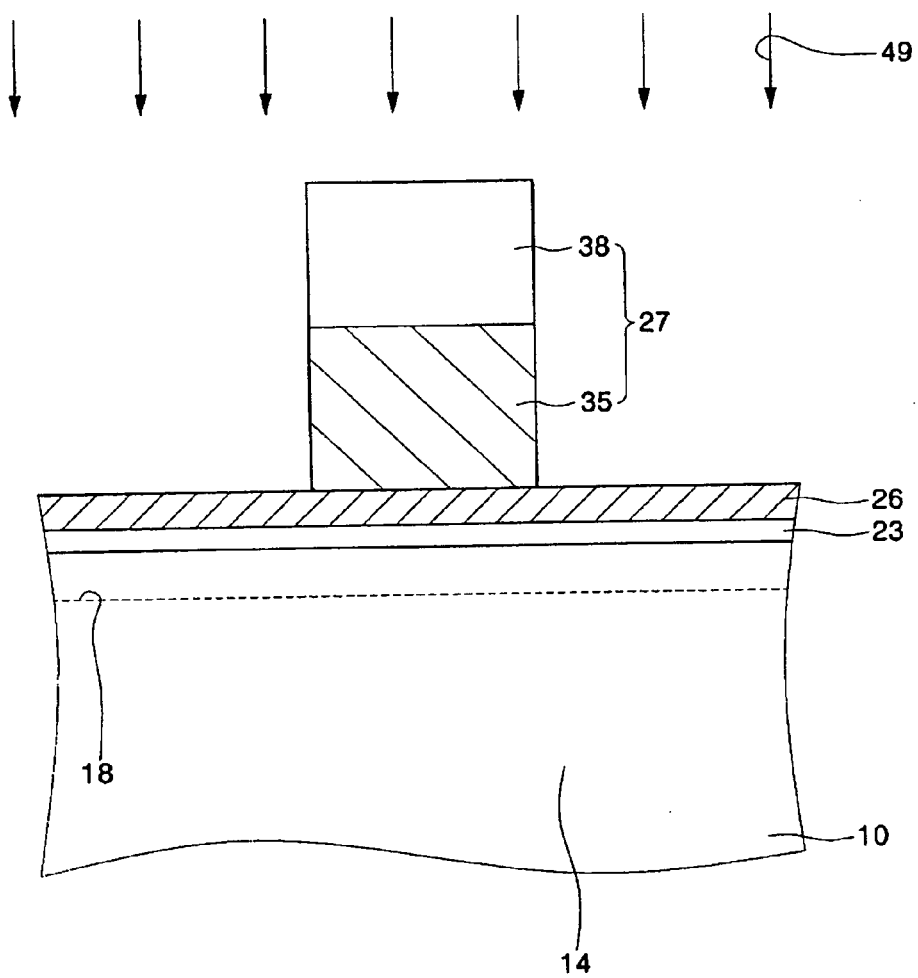

A mask layer 27 may be formed on the metal nitride layer 26. The mask layer 27 may be a mask pattern 80, as shown in FIG. 11. The mask layer 27 may also be a gate electrode 35 and/or a gate capping layer pattern 38, as shown in FIG. 6.

Figure 4:
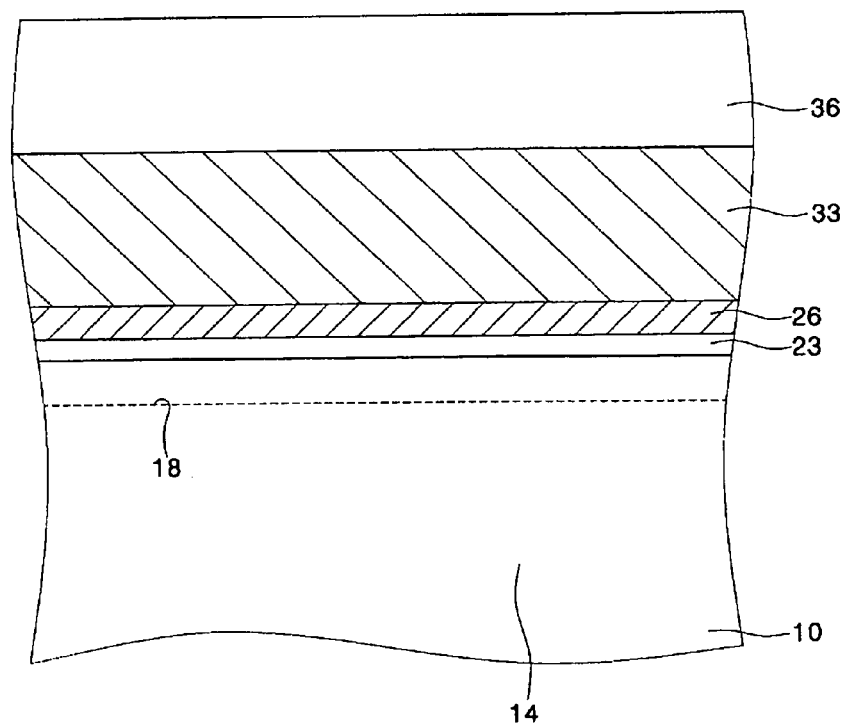

In accordance with yet another embodiment of the present invention, referring to FIG. 11, a mask pattern 80 may be formed on the metal nitride layer 26 (shown in FIG. 4). An etching process 50 may be performed on the metal nitride layer 26 using the mask pattern 80 as an etching mask and/or the gate insulating layer 23 as an etching buffer layer. The etching process 50 may form a metal nitride layer pattern 29 between the gate insulating layer 23 and the mask pattern 80. The metal nitride layer pattern 29 may be formed to traverse the active region 14, as shown in FIG. 2. The mask pattern 80 may be formed using poly-silicon, silicon oxide ($SiO_2$) and/or silicon nitride ($Si_3N_4$). Alternative configurations and/or materials are to be appreciated by one skilled in the art.

The etching process 50 may be performed using an etchant. Therefore, the etching process 50 may reduce and/or prevent etching damage to the gate insulating layer 23 and/or the semiconductor substrate 10. The etching process 50 may be performed using a etchant including an oxidizing agent, a chelate agent and/or a pH adjusting mixture. The etching process 50 may be performed using a wet or dry etching technique. The etchant may be wet or dry. The etchant may be a solid, liquid and/or gas.

Hereinafter the etchant will be referred to as the wet etchant. However, it is to be appreciated by one skilled in the art that a wet and/or dry etchant may also be used.

The pH adjusting mixture may be acidic and/or basic. The pH adjusting mixture may be formed by at least one selected from the group consisting of ammonium hydroxide ($NH_4OH$), sodium hydroxide (NaOH), potassium hydroxide (KOH), tetra-methyl ammonium hydroxide (TMAH) and/or cholline. The pH adjusting mixture may be formed by at least one selected from the group consisting of nitric acid ($HNO_3$), hydrochloric acid (HCl), phosphoric acid ($H_3PO_4$), sulfuric acid ($H_2SO_4$), hydrofluoric acid (HF), hydroiodic acid (HI) and/or iodic acid ($HIO_3$). The pH adjusting mixture may be a solid, liquid and/or gas.

The chelate agent may be formed by at least one selected from the group consisting of mono-ethanol amine ($C_2H_7NO$), di-ethanol amine ($C_4H_{11}NO_2$), tri-ethanol amine ($C_6H_{15}NO_3$), di-ethylene tri-amine ($C_4H_{13}N_3$), methyl amine ($CH_3NH_2$) and/or ethyl amine ($C_2H_5NH_2$). The chelate agent may be formed by at least one selected from the group consisting of propyl ($C_3H_7$—$NH_2$), butyl ($C_4H_9$—$NH_2$), pentyl ($C_5H_{11}$—$NH_2$) and/or hydro-carbonyl ($C_xH_y$—) wherein x is an integer greater than 5 and y is an integer greater than 11. The chelate agent may be formed by at least one selected from an amine carboxylic acid ligand and/or an amino acid.

The amino acid may be formed by at least one selected from the group consisting of glycine ($C_8H_9NO_3$), alacine ($C_3H_7NO_2$), valine (($CH_3$)$_2$CHCH($NH_2$)COOH), leucine ($C_6H_{13}NO_2$), isoleucine ($C_6H_{13}NO_2$), serine (HOCH$_2$CH($NH_2$)COOH), threonine ($C_4H_9NO_3$), tyrosine ($C_9H_{11}NO_2$), tryptophan ($C_{11}H_{12}N_2O_2$), glutamine ($C_6O_3H_{10}N_2$), aspartic acid ($C_4H_7O_4N$), lysine ($H_2N(CH_2)_4(NH_2)$COOH), arginine ($C_6H_{14}N_4O_2$), histidine ($C_6H_9N_3O_2$), cysteine ($C_3H_7NO_2S$), methionine ($C_5H_{11}NO_2S$), cystine ($C_6H_{12}N_2O_4S_2$), proline ($C_5H_9NO_2$), sulphamine ($C_6H_8N_2O_2S$) and/or hydroxyproline ($C_5H_9NO_3$). The amine carboxylic acid ligands may be formed using di-ethylene tri-amine penta-acetic acid ($C_6H_{16}N_3O_2$).

The oxidizing agent may be formed using hydrogen peroxide ($H_2O_2$). The oxidizing agent may be formed by at least one selected from the group consisting of ammonium iodate ($NH_4IO_3$), iodine ($I_2$) and/or potassium iodate ($KIO_3$).

Figure 12:
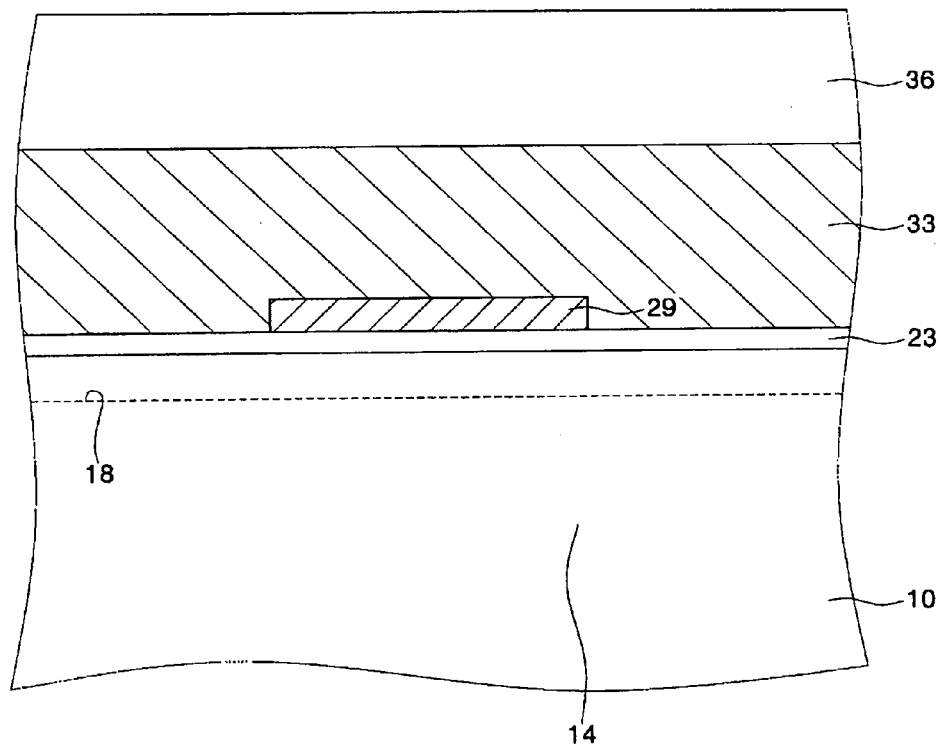

Referring to FIGS. 1, 2, 4, 5, 12 and 13, in accordance with example embodiments of the present invention, a gate electrode layer 33 and/or a gate capping layer 36 may be formed on the metal nitride layer 26, as shown in FIG. 4. Particularly, the mask pattern 80 may be removed from the semiconductor substrate 10, as shown in FIG. 12. The gate electrode layer 33 and/or the gate capping layer 36 may be formed on the gate insulating layer 23 to substantially cover the metal nitride layer pattern 29. The gate capping layer 36 may be formed using silicon nitride ($Si_3N_4$). The gate electrode layer 33 may be formed having n-type and/or p-type poly-silicon. The gate electrode layer 33 and the gate capping layer 36 may be patterned to form the gate electrode 35 and the gate capping layer pattern 38, respectively.

Figure 5:
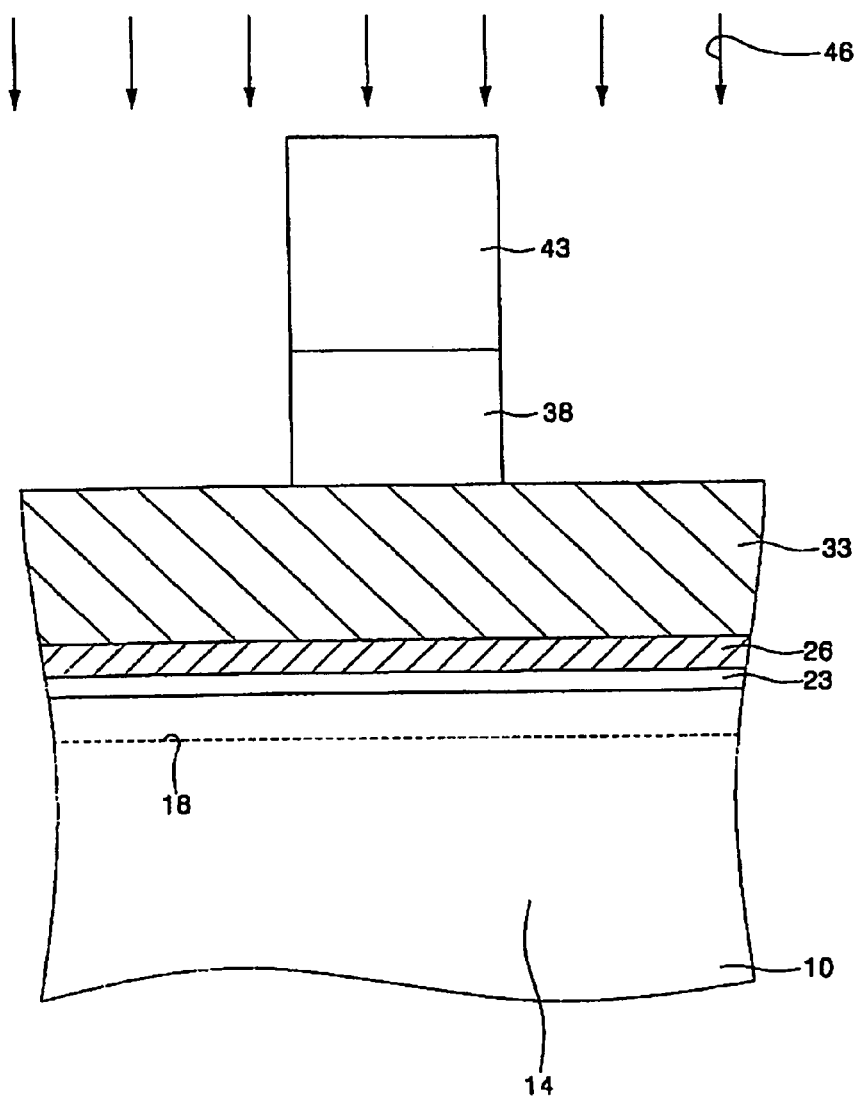
Figure 13:
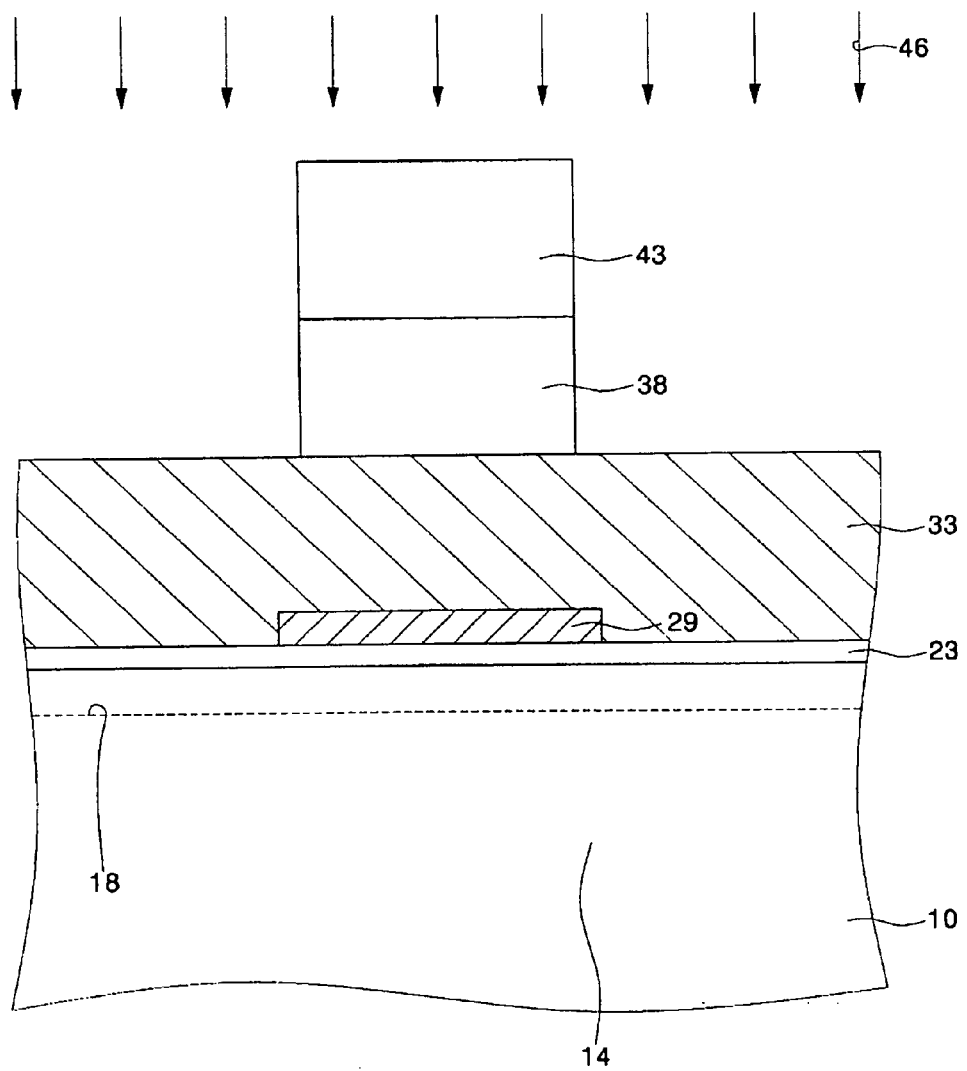

The formation of the gate capping layer pattern 38 will now be described in accordance with example embodiments of the present invention. A photoresist pattern 43, as shown in FIGS. 5 and 13, may be formed on the gate capping layer 36 (shown in FIGS. 4 and 12). An etching process 46 may be performed on the gate capping layer 36 using the photoresist pattern 43 as an etching mask. The etching process 46 may form a gate capping layer pattern 38 on the gate electrode layer 33. The gate capping layer pattern 38 may be formed between the photoresist pattern 43 and the gate electrode layer 33. The etching process 46 may be performed using a wet or dry etching technique.

Referring to FIGS. 1, 2, 6, 7, and 14, the formation of the gate electrode 35 in will now be described in accordance with yet other example embodiments of the present invention. The photoresist pattern 43 may be removed from the semiconductor substrate 10. An etching process 49 may be performed on the gate electrode layer 33, as shown in FIG. 6, to etch the gate electrode layer 33 using the gate capping layer pattern 38 as an etching mask and/or the metal nitride layer 26 as an etching buffer layer. The etching process 49 may form the gate electrode 35 on the metal nitride layer 26. The gate electrode 35 may be formed between the gate capping layer pattern 38 and/or the metal nitride layer 26. In another example embodiment of the present invention, the etching process 49 may be performed by a wet or dry etching technique.

Side walls 35a, 38a and/or 29a of the gate electrode 35, the gate capping layer pattern 38 and/or the metal nitride layer pattern 29, respectively, may be arranged along a substantially vertical line, V, substantially perpendicular to a top surface of the semiconductor substrate 10. Alternative configurations are to be appreciated by one skilled in the art.

Figure 14:
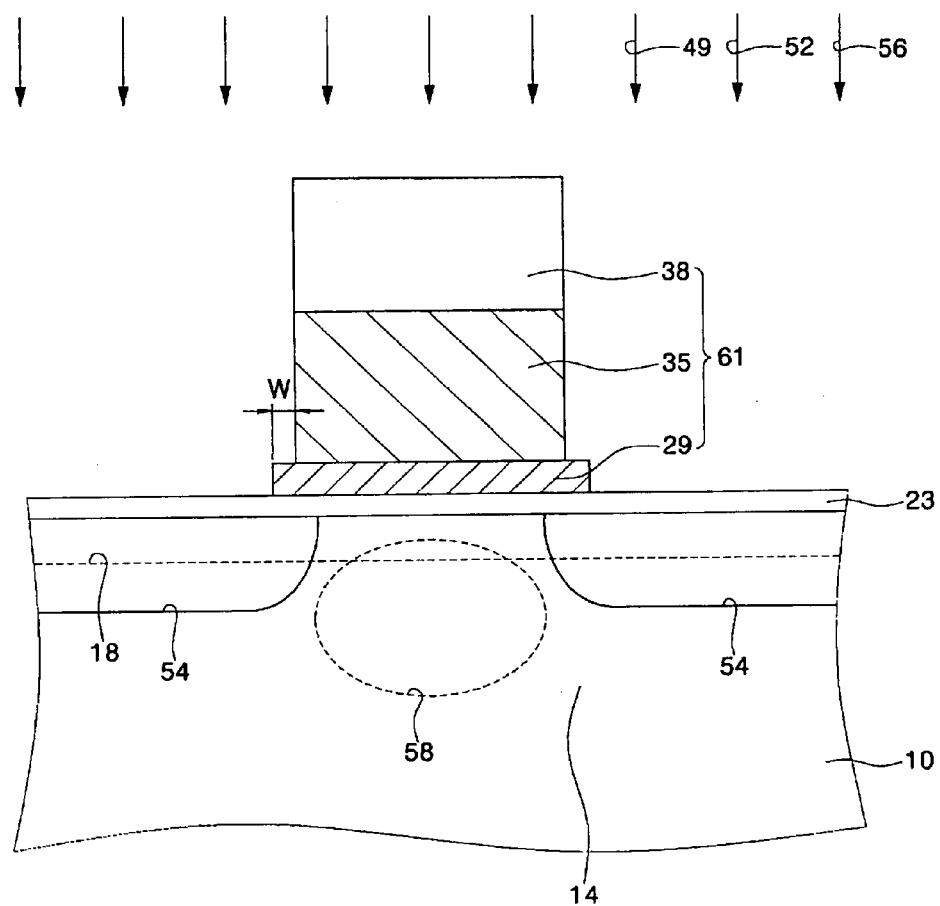

In accordance with another embodiment of the present invention, the etching process 49 may be performed to etch the gate electrode layer 33 using the gate capping layer pattern 38 as an etching mask. The metal nitride layer pattern 29 and/or gate insulating layer 23 may be used as an etching buffer layer, as shown in FIG. 14. The etching process 49 may form the gate electrode 35 between the gate capping layer pattern 38 and/or the metal nitride layer pattern 29.

The width of the gate electrode 35 may be reduced a predetermined distance W from each of side walls 29a of the metal nitride layer pattern 29. Side walls 35a of the gate electrode 35 and/or the gate capping layer pattern 38 may be formed along the substantially vertical line, V, substantially perpendicular to the top surface of the semiconductor substrate 10. Side walls 29a of the metal nitride layer pattern 29 may be a pair of parallel side walls. Side walls 35a of the gate electrode 35 may also be a pair of parallel side walls. The side walls 29a of the metal nitride layer pattern 29 may be formed to be spaced away from the side walls 35a of the gate electrode 35 and/or the gate capping layer pattern 38 by a predetermined distance, W. The gate electrode 35 may have a width smaller than the metal nitride layer pattern 29. The gate electrode 35 may be formed substantially the same width as the metal nitride layer pattern 29 by adjusting a width of the photoresist pattern 43 of FIG. 13. The metal nitride layer pattern 29, the gate electrode 35 and/or the gate capping layer pattern 38 may form a gate pattern 61, according to an example embodiment. Other configurations should be appreciated by one skilled in the art.

Figure 7:
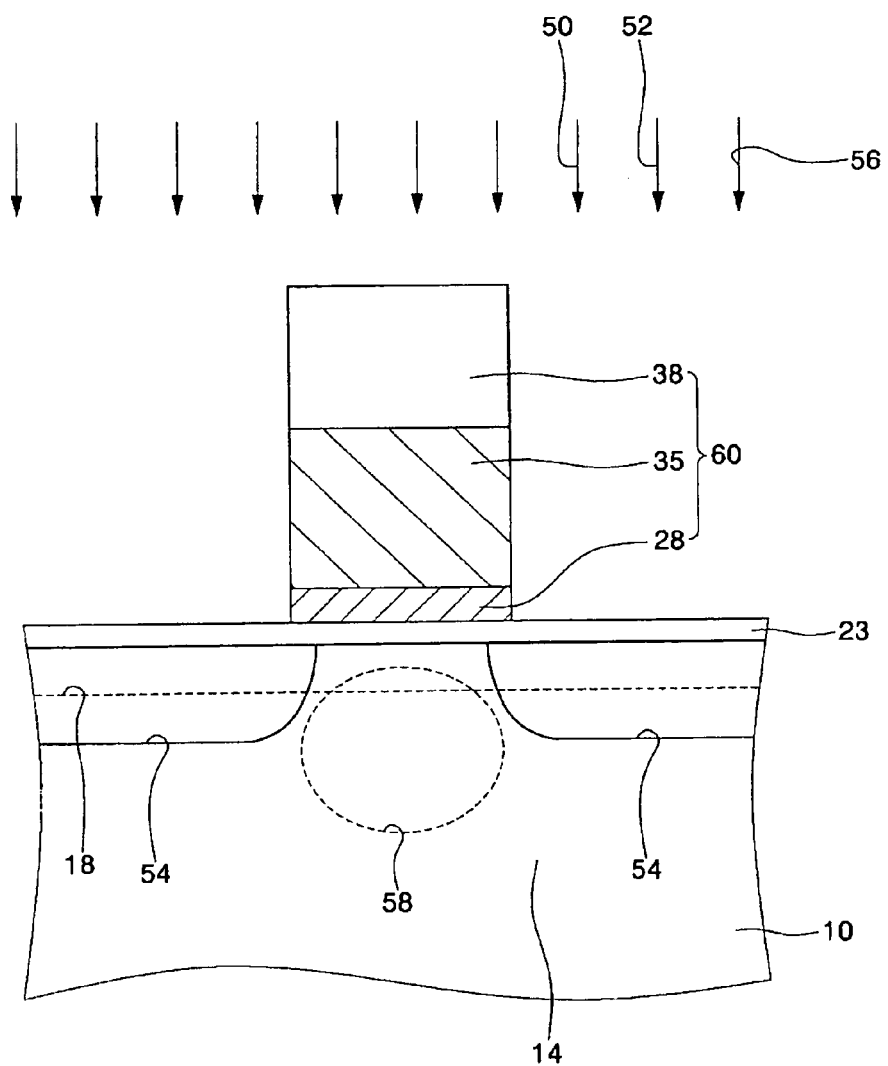

The etching process 50 may be performed on the metal nitride layer 26 using the gate capping layer pattern 38 and/or the gate electrode 35 as an etching mask. The gate insulating layer 23 may be used as an etching buffer layer, as shown in FIG. 7. The etching process 50 may form a metal nitride layer pattern 28 on the gate insulating layer 23. The metal nitride layer pattern 28 may be formed between the gate electrode 35 and the gate insulating layer 23. The metal nitride layer pattern 28 may be formed to have substantially the same width as that of the gate electrode 35. The metal nitride layer pattern 28, the gate electrode 35 and/or the gate capping layer pattern 38 may form a gate pattern 60 according to example embodiments of the present invention.

The etching process 50 may be performed using the same wet etchant, as shown in FIG. 11. Therefore, the etching process 50 may reduce and/or prevent etching damage to the gate insulating layer 23 and/or the semiconductor substrate 10. The etching process 50 may be performed by the wet etchant having an oxidizing agent, a chelate agent and/or a pH adjusting mixture. In another example embodiment of the present invention, the etching process 50 may be performed by a wet or dry etching technique.

The pH adjusting mixture may be formed using an acidic solution and/or a basic solution. The basic solution may be formed by at least one selected from the group consisting of ammonium hydroxide ($NH_4OH$), sodium hydroxide (NaOH), potassium hydroxide (KOH), tetra-methyl ammonium hydroxide (TMAH) and/or cholline. The acidic solution may be formed by at least one selected from the group consisting of nitric acid ($HNO_3$), hydrochloric acid (HCl), phosphoric acid ($H_3PO_4$), sulfuric acid ($H_2SO_4$), hydrofluoric acid (HF), hydroiodic acid (HI), and iodic acid ($HIO_3$).

The chelate agent may be formed by at least one selected from the group consisting of mono-ethanol amine ($C_2H_7NO$), di-ethanol amine ($C_4H_{11}NO_2$), tri-ethanol amine ($C_6H_{15}NO_3$), di-ethylene tri-amine ($C_4H_{13}N_3$), methyl amine ($CH_3NH_2$) and/or ethyl amine ($C_2H_5NH_2$). The chelate agent may be formed by at least one selected from the group consisting of propyl ($C_3H_7$—$NH_2$), butyl ($C_4H_9$—$NH_2$), pentyl ($C_5H_{11}$—$NH_2$) and/or hydro-carbonyl ($C_xH_y$—) wherein x may be an integer greater than 5 and y may be an integer greater than 11. The chelate agent may be formed by at least one selected from an amine carboxylic acid ligand and/or an amino acid.

The amino acid may be formed by at least one selected from the group consisting of glycine ($C_8H_9NO_3$), alacine ($C_3H_7NO_2$), valine (($CH_3)_2CHCH(NH_2)COOH$), leucine ($C_6H_{13}NO_2$), isoleucine ($C_6H_{13}NO_2$), serine ($HOCH_2CH(NH_2)COOH$), threonine ($C_4H_9NO_3$), tyrosine ($C_9H_{11}NO_2$), tryptophan ($C_{11}H_{12}N_2O_2$), glutamine ($C_6O_3H_{10}N_2$), aspartic acid ($C_4H_7O_4N$), lysin ($H_2N(CH_2)_4(NH_2)COOH$), arginine ($C_6H_{14}N_4O_2$), histidine ($C_6H_9N_3O_2$), cysteine ($C_3H_7NO_2S$), methionine ($C_5H_{11}NO_2S$), cystine ($C_6H_{12}N_2O_4S_2$), proline ($C_5H_9NO_2$), sulphamine ($C_6H_8N_2O_2S$) and/or hydroxyproline $C_5H_9NO_3$). The amine carboxylic acid ligands may be formed using di-ethylene tri-amine penta-acetic acid ($C_6H_{16}N_3O_2$).

The oxidizing agent may be formed using hydrogen peroxide ($H_2O_2$). The oxidizing agent may be formed by at least one selected from the group consisting of ammonium iodate ($NH_4IO_3$), iodine ($I_2$) and/or potassium iodate ($KIO_3$).

An ion implantation process 52 may be performed in the semiconductor substrate 10 using the gate pattern 60 and/or the gate pattern 61, as shown in FIGS. 7 and 14, respectively. The ion implantation process 52 may form lower-concentration source-drain regions 54 that may overlap the gate pattern 60 and/or gate pattern 61. The lower-concentration source and/or drain regions 54 may be formed to have a conductivity type different from the channel region 18. An ion implantation process 56 may be performed on the semiconductor substrate 10 using the gate pattern 60 and/or the gate pattern 61 as a mask. The ion implantation process 56 may form a punch-retarding region 58 in the semiconductor substrate 10 substantially between the lower-concentration source-drain regions 54. The punch-retarding region 58 may be formed to have the same conductivity type as the channel region 18. The punch-retarding region 58 may reduce and/or prevent puncture of the lower-concentration source-drain regions 54.

Figure 8:
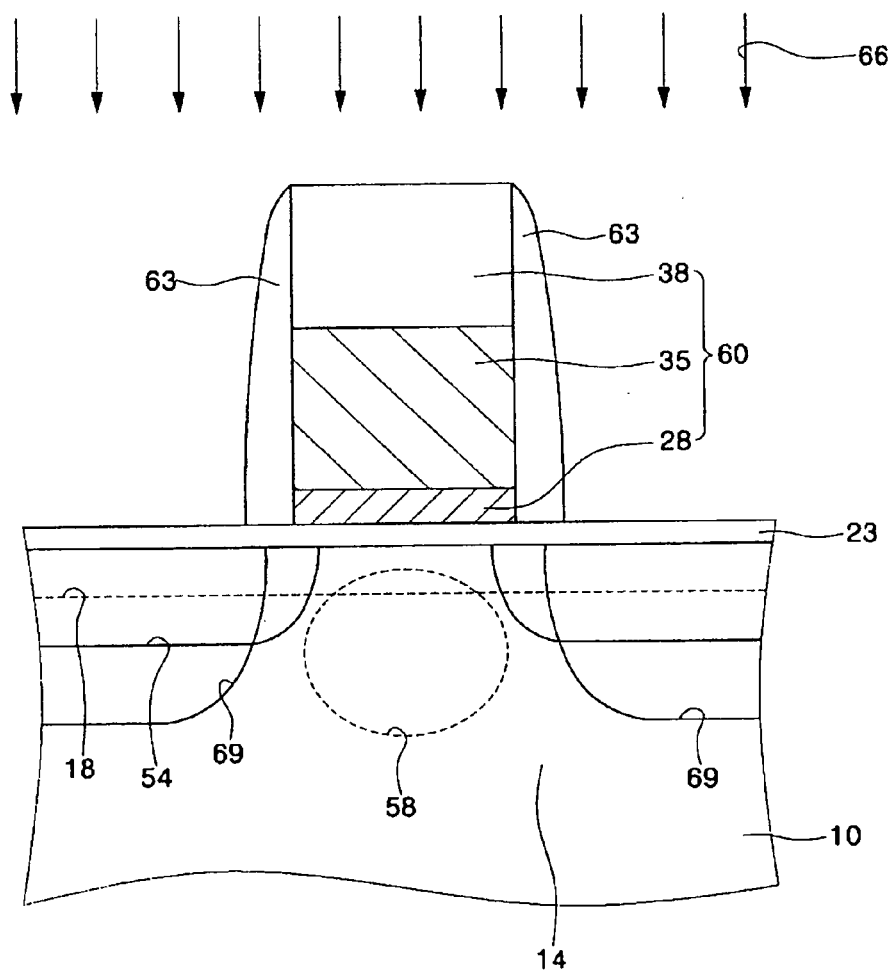
Figure 15:
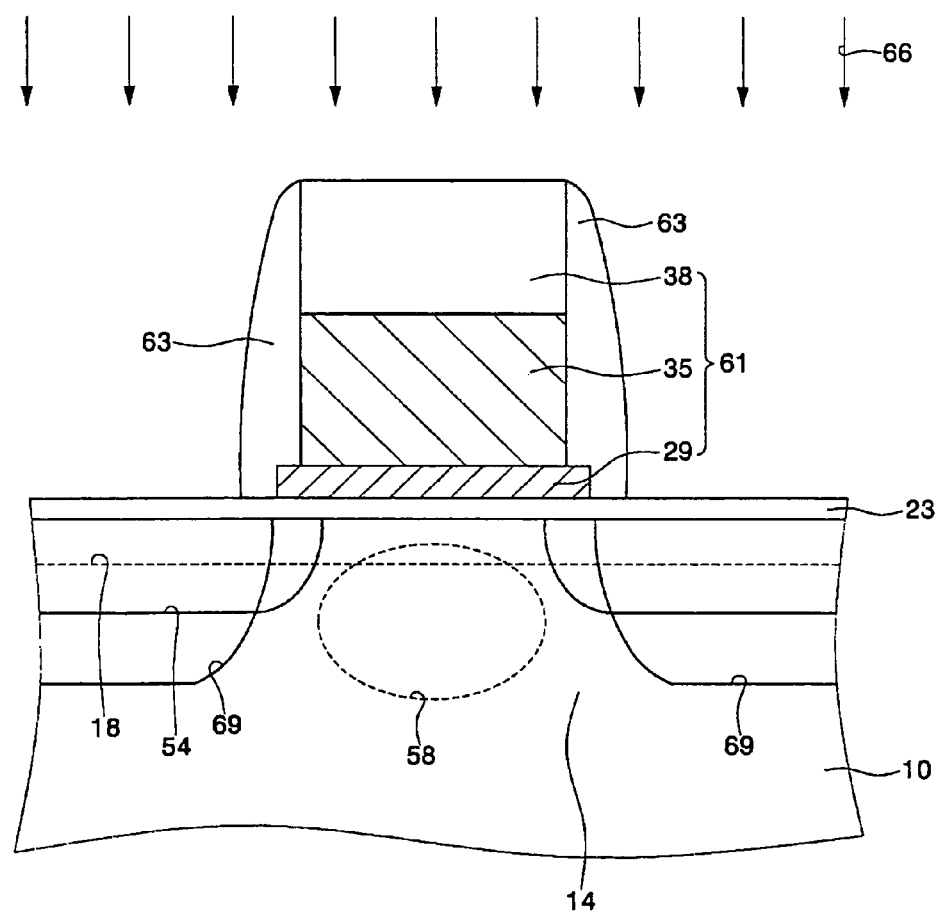

Referring to FIGS. 1, 2, 8, and 15, gate spacers 63 may be formed on side walls of the gate pattern 60 and/or the gate pattern 61, as shown in FIGS. 8 and 15. The gate spacers 63 may be formed using an insulating layer having an etching rate different from the gate insulating layer 23. By using the gate pattern 60 and/or the gate pattern 61 as a mask and/or the gate spacers 63, an ion implantation process 66 may be performed in the semiconductor substrate 10. The ion implantation process 66 may form higher-concentration source-drain regions 69 overlapping the gate spacers 63. The higher-concentration source-regions 69 also may overlap the lower-concentration source-drain regions 54, respectively. The higher-concentration source and/or drain regions 69 may be formed to have substantially the same conductivity type as those of the lower-concentration source regions 54.

Figure 9:
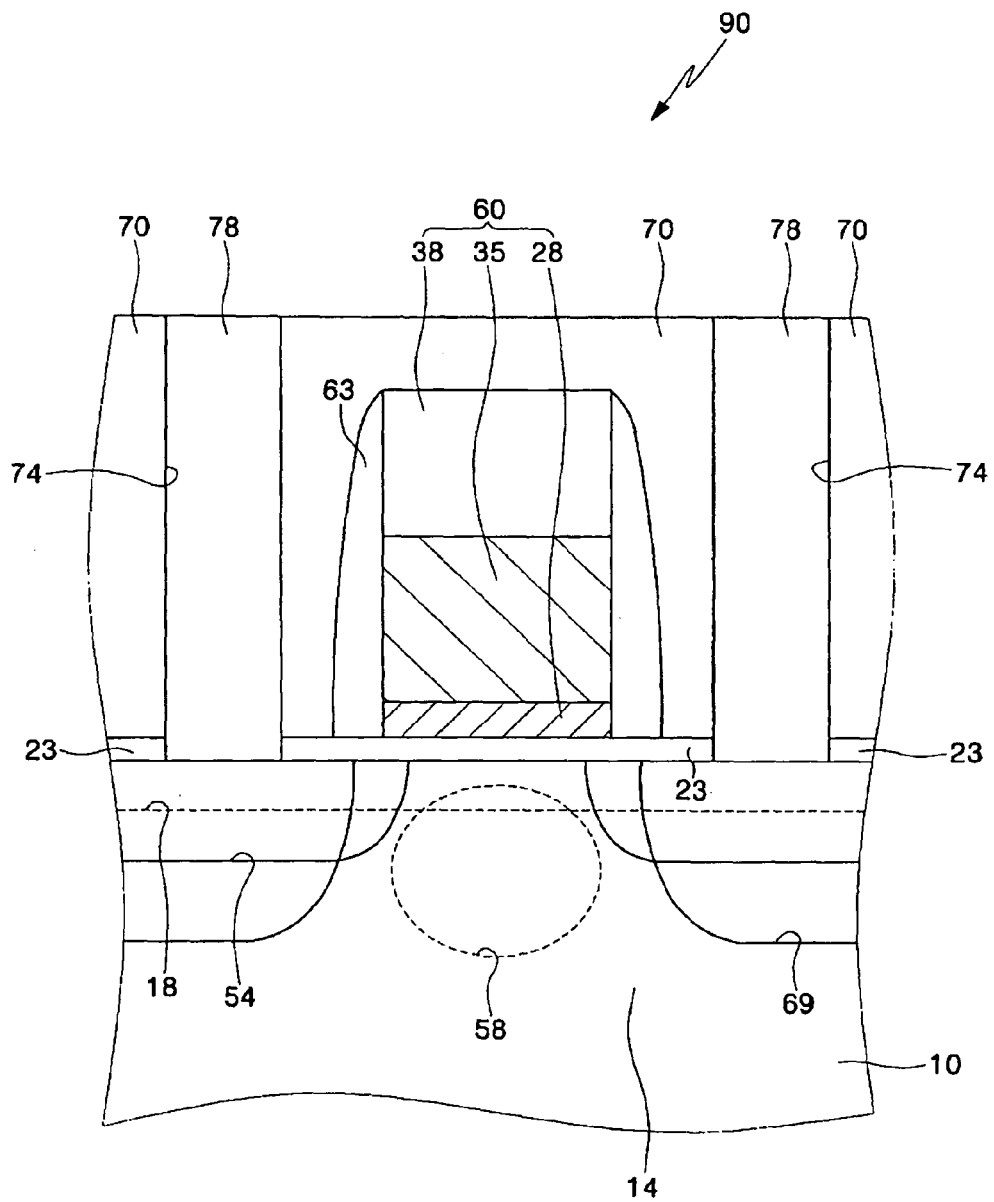
Figure 16:
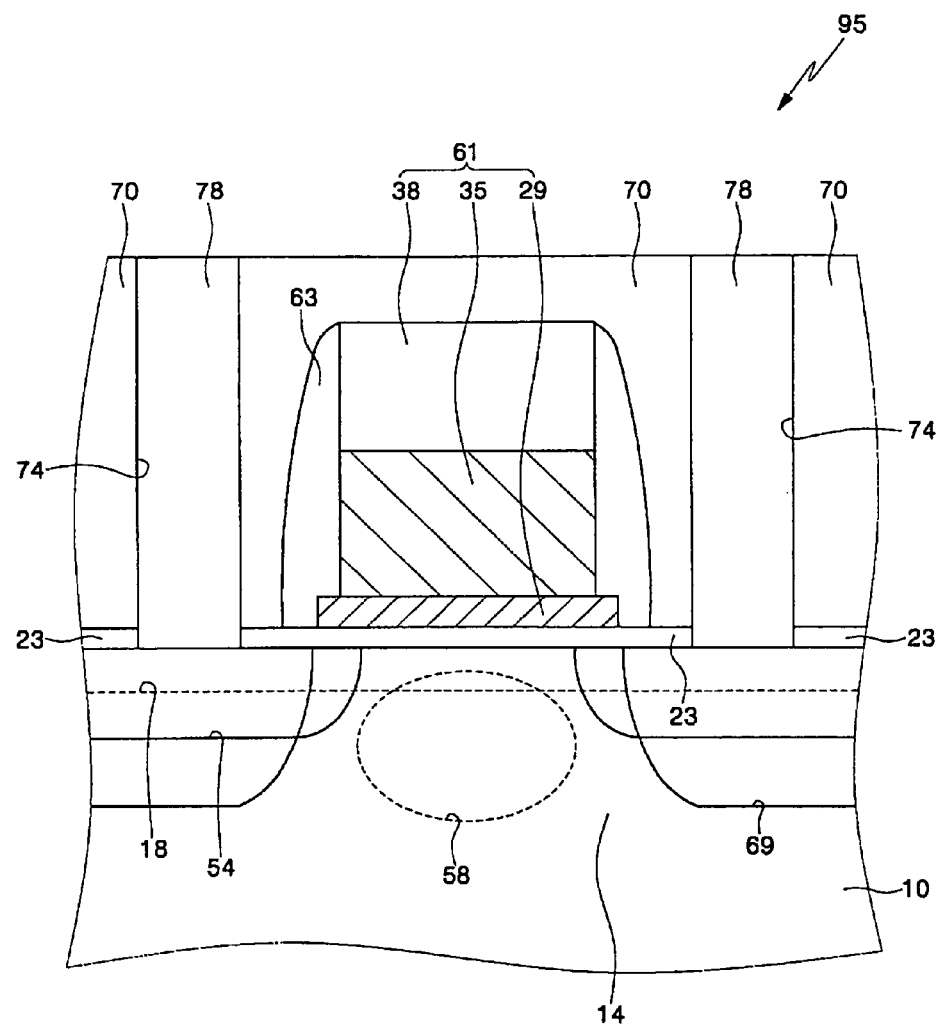

Referring to FIGS. 1, 2, 9, and 16, a planarized interlayer insulating layer 70 may be formed on the gate insulating layer 23 to cover the gate spacers 63, the gate pattern 60 and/or gate patterns 61, as shown in FIGS. 9 and 16. The planarizing interlayer insulating layer 70 may be formed using an insulating layer having substantially the same etching rate as that of the gate insulating layer 23. Node holes 74 may be formed on both side portions of the gate pattern 60 and/or gate pattern 61. Electrical nodes 78 may be formed in the planarized interlayer insulating layer 70 to fill the node holes 74. The electrical nodes 78 may be formed using a conductive layer. In accordance with example embodiments of the present invention, transistor 90 and/or transistor 95 may be formed, as shown in FIGS. 9 and 16.

Figure 17:
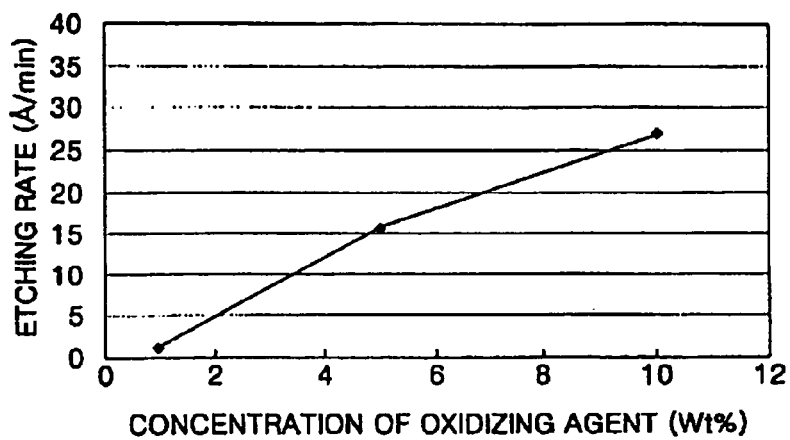
Figure 18:
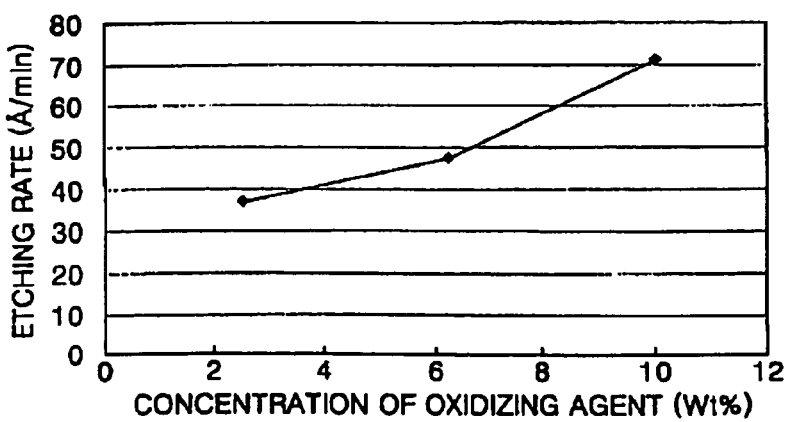

FIGS. 17 and 18 are graphs showing etching rate of a wet enchant that may be used in FIGS. 3 to 16.

Referring to FIGS. 17 and 18, according to example embodiments of the present invention, the metal nitride layer patterns 28 and/or 29, under the gate electrode 35, may be formed using a wet etchant during the performance of the etching process 50. The wet etchant may have an oxidizing agent, a chelate agent and/or a pH adjusting mixture. The wet etchant may be used by mixing the oxidizing agent with the chelate agent and/or the pH adjusting mixture.

The etching process 50 may etch the metal nitride layer 26 using the oxidizing agent in the wet etchant. The chelate agent may reduce and/or prevent etching by-products from being adsorbed onto the metal nitride layer 26 in the wet etchant. In a basic solution, the wet etchant may have a higher etching rate compared to the metal nitride layer 26, as opposed to the wet etchant in an acidic solution.

By adjusting the weight concentration (%) of the oxidizing agent and/or a pH value in the wet etchant, while a weight concentrate (%) of the chelate agent in the wet etchant remains substantially constant, the etching rate of the metal nitride layer 25 may be monitored and/or controlled.

The wet etchant may have lower etching rates to the metal nitride layer 26 in pH values of approximately 7 or less, according to weight concentrations of the oxidizing agent, as shown in FIG. 17. For example, if the weight concentrations of the oxidizing agent are approximately 3 wt % and 10 wt % respectively, the wet etchant may have etching rates of about 9 Å/min and about 27 Å/min to the metal nitride layer 26. According to other example embodiments, the wet etchant may have higher etching rates to the metal nitride layer 26 in pH values of about 7 or more, according to weight concentrations of the oxidizing agent, as shown in FIG. 18. For example, if the weight concentrations of the oxidizing agent are approximately 3 wt % and 10 wt % respectively, the wet etchant may have the etching rates of about 39 Å/min and about 70 Å/min to the metal nitride layer 26. Thus, the etching process 50 may etch the metal nitride layer 26 within a predetermined time using the wet etchant.

As described the above, example embodiments of the present invention provide a method capable of reducing etching damage to a gate insulating layer and/or a semiconductor substrate by performing an etching process with a wet etchant on a metal nitride layer between the gate insulating layer and a gate electrode. As a result, example embodiments of the present invention may allow a transistor to have better electrical characteristics by reducing the etching damage to the gate insulating layer and/or the semiconductor substrate.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A semiconductor transistor comprising:
    a gate insulating layer formed on a semiconductor substrate;
    a gate pattern formed on the gate insulating layer, the gate pattern including a patterned metal nitride layer on the gate insulating layer, a gate electrode layer on the patterned metal nitride layer, and a gate capping layer pattern on the gate electrode layer;
    a first gate spacer on a first side of the gate pattern; and
    a second spacer on a second side of the gate pattern,
    wherein the gate insulating layer extends outside of the first and second gate spacers, the first gate spacer is separate from the second gate spacer, and the metal nitride layer has a larger width than the gate electrode layer such that sidewalls of the metal nitride layer are spaced apart from sidewalls of the gate electrode layer.

* * * * *